United States Patent
Yoshinaga et al.

(10) Patent No.: US 10,389,265 B2
(45) Date of Patent: Aug. 20, 2019

(54) MODULE, AND POWER CONVERSION APPARATUS AND MOTOR USING THE MODULE

(71) Applicants: Nidec Corporation, Kyoto (JP); ROHM Co., Ltd., Kyoto-shi, Kyoto (JP)

(72) Inventors: Masaki Yoshinaga, Kyoto (JP); Masato Nakanishi, Kyoto (JP); Yasuo Ishiyama, Kyoto (JP); Toru Takahashi, Kyoto (JP); Takumi Okada, Kyoto (JP); Katsuhiko Yoshihara, Kyoto (JP)

(73) Assignees: Nidec Corporation, Kyoto (JP); ROHM Co., Ltd., Kyoto (JP)

(*) Notice: Subject to any disclaimer, the term of this patent is extended or adjusted under 35 U.S.C. 154(b) by 58 days.

(21) Appl. No.: 15/505,439

(22) PCT Filed: Aug. 21, 2015

(86) PCT No.: PCT/JP2015/073497
§ 371 (c)(1),
(2) Date: Feb. 21, 2017

(87) PCT Pub. No.: WO2016/027882
PCT Pub. Date: Feb. 25, 2016

(65) Prior Publication Data
US 2017/0271999 A1    Sep. 21, 2017

(30) Foreign Application Priority Data

Aug. 22, 2014  (JP) .................................. 2014-169695
Aug. 18, 2015  (JP) .................................. 2015-161363

(51) Int. Cl.
*H02K 1/24*     (2006.01)
*H02M 7/00*     (2006.01)
(Continued)

(52) U.S. Cl.
CPC .......... *H02M 7/003* (2013.01); *H01L 25/072* (2013.01); *H01L 27/0629* (2013.01);
(Continued)

(58) Field of Classification Search
CPC .. H02M 7/003; H02P 1/00; H02P 6/20; H02P 8/04
See application file for complete search history.

(56) References Cited

U.S. PATENT DOCUMENTS 6,014,003 A * 1/2000 French ..................... H02P 9/40
                                                                     318/254.2
7,772,729 B2 * 8/2010 Adra ......................... H02K 3/28
                                                                     310/68 B
(Continued)

FOREIGN PATENT DOCUMENTS

JP        3379429 B2    2/2003
JP     2008-048503 A    2/2008
(Continued)

OTHER PUBLICATIONS

B. J. Baliga, "Power semiconductor device figure of merit for high-frequency applications," in IEEE Electron Device Letters, vol. 10, No. 10, pp. 455-457, Oct. 1989.*

*Primary Examiner* — Eduardo Colon Santana
*Assistant Examiner* — Said Bouziane
(74) *Attorney, Agent, or Firm* — Keating & Bennett, LLP (57) ABSTRACT

A circuit element includes an upper switching device, a lower switching device, an upper diode device, and a lower diode device. An upper drain is connected to a first terminal connected to a positive electrode of a power supply, and an upper source is connected to a third terminal. A lower drain is connected to a fourth terminal, and a lower source is connected to a second terminal connected to a negative electrode of the power supply. An upper anode is connected to the fourth terminal, and an upper cathode is connected to (Continued)

the first terminal. A lower anode is connected to the second terminal, and a lower cathode is connected to the third terminal. The third terminal and the fourth terminal are arranged so as to be able to be short-circuited outside of a package.

15 Claims, 10 Drawing Sheets

(51) Int. Cl.
| | |
|---|---|
| *H01L 27/06* | (2006.01) |
| *H01L 29/16* | (2006.01) |
| *H02K 11/33* | (2016.01) |
| *H02P 27/04* | (2016.01) |
| *H02P 25/022* | (2016.01) |
| *H02P 25/092* | (2016.01) |
| *H01L 25/07* | (2006.01) |
| *H02M 7/537* | (2006.01) |
| *H02M 7/5387* | (2007.01) |
| *H02P 27/08* | (2006.01) |

(52) U.S. Cl.
CPC ......... *H01L 29/1608* (2013.01); *H02K 1/246* (2013.01); *H02K 11/33* (2016.01); *H02M 7/537* (2013.01); *H02M 7/5387* (2013.01); *H02P 25/022* (2013.01); *H02P 25/0925* (2016.02); *H02P 27/04* (2013.01); *H02P 25/092* (2016.02); *H02P 27/08* (2013.01)

(56) References Cited

U.S. PATENT DOCUMENTS

| | | | |
|---|---|---|---|
| 2005/0035434 A1* | 2/2005 | Fissore | H01L 23/49861 257/666 |
| 2011/0316373 A1* | 12/2011 | Kobayashi | H01R 9/24 310/71 |
| 2017/0263535 A1* | 9/2017 | Nakano | H01L 23/48 |

FOREIGN PATENT DOCUMENTS

| | | |
|---|---|---|
| JP | 4476465 B2 | 6/2010 |
| JP | 2011-036016 A | 2/2011 |

* cited by examiner

MODULE, AND POWER CONVERSION APPARATUS AND MOTOR USING THE MODULE

BACKGROUND OF THE INVENTION

1. Field of the Invention

The present invention relates to a module, and a power conversion apparatus and a motor using the module.

2. Description of the Related Art

A power conversion apparatus that converts direct-current power to alternating-current power is used for applying a voltage to a coil of a motor. The power conversion apparatus used for a motor is composed of a bridge circuit including a semiconductor device and a diode device. Examples of the bridge circuit include a half bridge circuit, a full bridge circuit, and a three-phase bridge circuit. For example, Japanese Patent No. 3379429 discloses a circuit configuration of one arm in a three-phase bridge circuit.

SUMMARY OF THE INVENTION

Typically, a module constituting the three-phase bridge circuit is used for driving a three-phase synchronous motor. On the other hand, a three-phase half bridge circuit can be used for driving a concentrated winding SR motor (switched reluctance motor). The three-phase half bridge circuit is a circuit in which three half bridge circuits are connected in parallel to each other. However, currently, mass-production of a module constituting the three-phase half bridge circuit has not been achieved. Therefore, in order to drive the concentrated winding SR motor, a configuration is generally used in which two modules in each of which the three-phase bridge circuit is employed as a configuration of a bridge circuit are connected to configure a power conversion apparatus for the concentrated winding SR motor. However, since the power conversion apparatus needs to use the two modules of the three-phase bridge circuits, the concentrated winding SR motor including the power conversion apparatus becomes expensive.

Therefore, in order to solve the problem, preferred embodiments of the present invention provide a module constituting at least a portion of a power conversion apparatus, the module being able to be used for both of a concentrated winding three-phase SR motor and a three-phase synchronous motor.

Solution to Problem

A form of a module according to the present invention is a module constituting at least a portion of a power conversion apparatus, the module including a package, a circuit element arranged on the inside of the package, and a plurality of terminals. The circuit element includes an upper switching device, a lower switching device, an upper diode device, and a lower diode device. The upper switching device includes an upper drain and an upper source. The upper drain is connected to a first terminal connected to a positive electrode of a power supply out of the plurality of terminals. The upper source is connected to a third terminal out of the plurality of terminals. The lower switching device includes a lower drain and a lower source. The lower drain is connected to a fourth terminal out of the plurality of terminals. The lower source is connected to a second terminal connected to a negative electrode of the power supply out of the plurality of terminals. The upper diode device includes an upper anode and an upper cathode. The upper anode is connected to the fourth terminal. The upper cathode is connected to a fifth terminal out of the plurality of terminals. The lower diode device includes a lower anode and a lower cathode. The lower anode is connected to the second terminal. The lower cathode is connected to the third terminal. The third terminal and the fourth terminal are arranged so as to be able to be short-circuited outside of the package.

Advantageous Effect of Invention

By adding a simple configuration to the module constituting a half bridge circuit of the present invention, the module can function as a power conversion apparatus that can be used for both of a concentrated winding three-phase SR motor and a three-phase synchronous motor. Therefore, the module of the present invention can be applied to more types of motors.

Therefore, the module of the half bridge circuit is easily mass-produced, and a cost decrease is achieved by the mass production. As a result, the power conversion apparatus or the concentrated winding SR motor and the three-phase synchronous motor can be provided at low cost.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
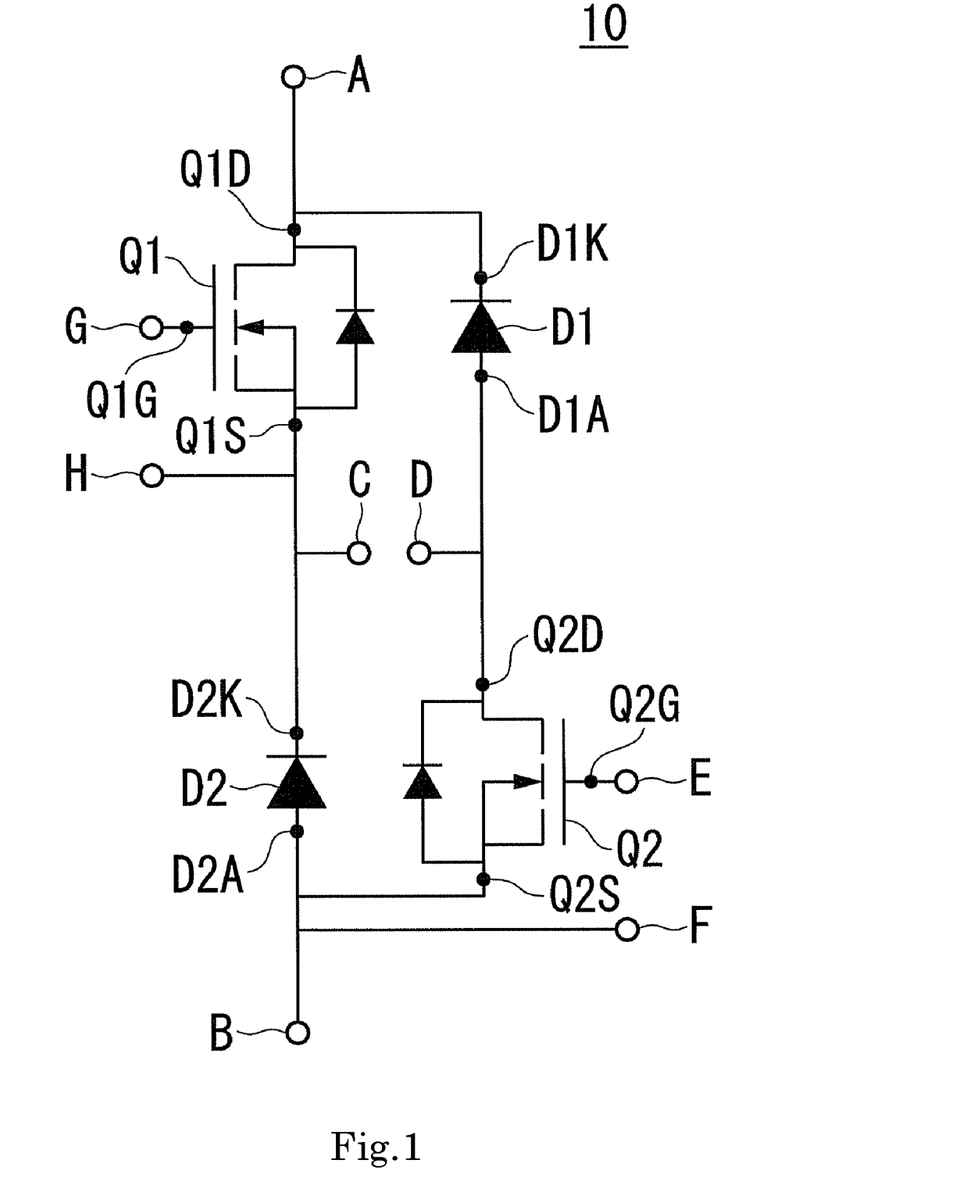
FIG. 1 is a view illustrating a circuit configuration of a module 10 of a half bridge circuit of a preferred embodiment of the present invention.

In the following, a module of one preferred embodiment of the present invention is described by reference to the drawings. FIG. 1 is a view illustrating a circuit configuration of a module 10 of the preferred embodiment. The module 10 constitutes one half bridge circuit. The module 10 includes a circuit element and a plurality of terminals. The circuit element includes an upper switching device Q1, a lower switching device Q2, an upper diode device D1, and a lower diode device D2. In the preferred embodiment, a transistor is used for each of the upper switching device Q1 and the lower switching device Q2. Note that a device used for the upper and lower switching devices Q1 and Q2 is not limited to the transistor. The plurality of terminals of the module 10 include a first terminal A, a second terminal B, a third terminal C, a fourth terminal D, a sixth terminal F, a seventh terminal G, an eighth terminal H, and a ninth terminal E.

The upper switching device Q1 includes an upper drain Q1D, an upper gate Q1G, and an upper source Q1S. The upper diode device D1 includes an upper anode D1A and an upper cathode D1K. The lower switching device Q2 includes a lower drain Q2D, a lower gate Q2G, and a lower source Q2S. The lower diode device D2 includes a lower anode D2A and a lower cathode D2K.

The upper drain Q1D is connected to the first terminal A. Preferably, the first terminal A is connected to a positive electrode of a power supply (not shown). The upper gate Q1G is connected to the seventh terminal G. The upper source Q1S is connected to the eighth terminal H, the third terminal C, and the lower cathode D2K. The lower drain Q2D is connected to the fourth terminal D and the upper anode D1A. The lower gate Q2G is connected to the ninth terminal E. The lower source Q2S is connected to the second terminal B and the sixth terminal F. The second terminal B is connected to a negative electrode of the power supply. The upper anode D1A is connected to the fourth terminal D and the lower drain Q2D. The upper cathode D1K is connected to the first terminal A. Note that the upper cathode D1K may be connected to a fifth terminal A'. In the preferred embodiment described using FIG. 1, the first terminal A and the fifth terminal A' are the same terminal. The lower anode D2A is connected to the second terminal B and the sixth terminal F. The lower cathode D2K is connected to the third terminal C, the eighth terminal H, and the upper source Q1S. Note that the sixth terminal F and the eighth terminal H can be used as, for example, terminals for Kelvin connection. In this case, a voltage between a gate and a source can be accurately checked by the Kelvin connection.

Here, the upper switching device Q1, the lower switching device Q2, the upper diode device D1, and the lower diode device D2 are switching devices. The respective devices are preferably devices formed of SiC (silicon carbide). A conventional MOS-FET (metal oxide semiconductor-field effect transistor) has a property that ON resistance is high. Also, an IGBT (insulated gate bipolar transistor) has a property that a tail current is easily generated in a high frequency region. The properties become more noticeable, for example, in a case in which a permanent magnet synchronous motor is in a high speed rotation state, and the number of switching times of each device is increased, and in a case in which a switching frequency is raised. When the number of switching times is increased and the switching frequency is raised, a switching loss is increased. On the other hand, the SiC device has lower ON resistance as compared to the MOS-FET, and the tail current as in the IGBT is also not generated. Therefore, less heat is generated in the circuit element. Thus, the SiC device is suitable to drive a motor in a high rotation region in which high speed switching needs to be performed, and to be used at a high voltage and a high temperature. Note that a device formed of, for example, GaN (gallium nitride) instead of SiC may be used, the IGBT and the MOS-FET may be also used for the upper switching device Q1, the lower switching device Q2, the upper diode device D1, and the lower diode device D2.

Figure 2:
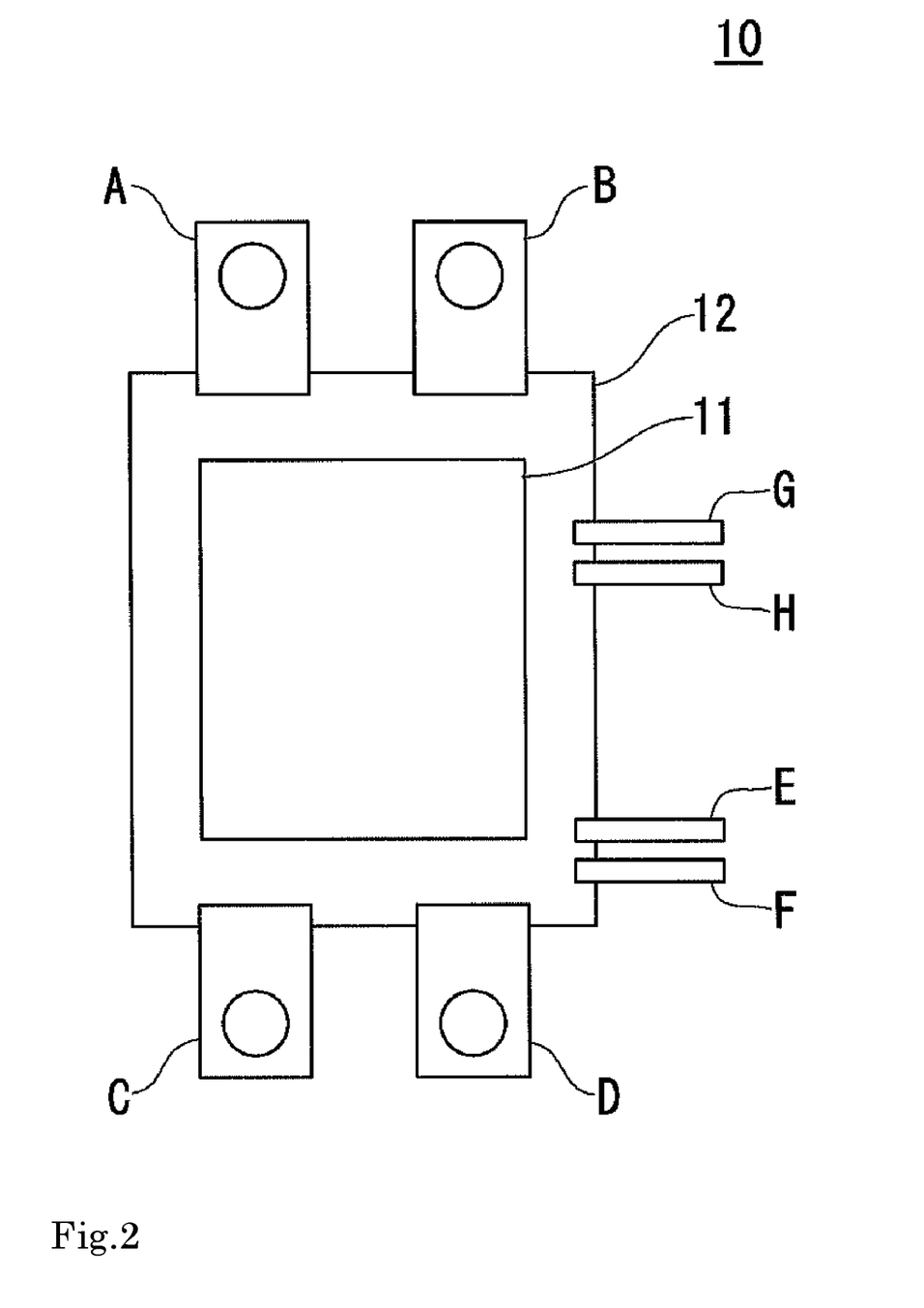
FIG. 2 is a view illustrating a structure of the module 10 of the half bridge circuit of the preferred embodiment of the present invention.

FIG. 2 is a view illustrating a structure of the module 10 of the half bridge circuit in the preferred embodiment. As shown in FIG. 2, the module 10 includes the first terminal A, the second terminal B, the third terminal C, the fourth terminal D, the sixth terminal F, the seventh terminal G, the eighth terminal H, the ninth terminal E, a circuit element 11, and a package 12. In FIG. 2, the respective terminals project from a surface of the package 12. The circuit element 11 is arranged within the package 12. In this preferred embodiment, each of the first terminal A, the second terminal B, the third terminal C, and the fourth terminal D has a plate shape. Each of the first terminal A, the second terminal B, the third terminal C, and the fourth terminal D includes a through-hole that penetrates the terminal in a plate thickness direction. For example, the through-hole connects each of the terminals and an electrically conductive wire leading to the outside of the package 12. As shown in FIG. 2, the package 12 preferably has a substantially rectangular shape in plan view. The first terminal A and the second terminal B extend from one side of the package 12 toward one side (an upper side of the paper in FIG. 2) that is the outside of the package 12. The third terminal C and the fourth terminal D extend from another side of the package 12 toward another side (a lower side of the paper in FIG. 2) that is the outside of the package 12. Note that the third terminal C and the fourth terminal D may be configured to extend from another side (a left side in FIG. 2) of the package 12 toward another side (a left side of the paper in FIG. 2) that is the outside of the package 12, and are not limited to a particular configuration. The seventh terminal G and the eighth terminal H extend from one side of the package 12 toward a right side of the paper in FIG. 2. The ninth terminal E and the sixth terminal F extend from one side of the package 12, in which at least a portion of the seventh terminal G and a portion of the eighth terminal H are arranged, toward a right side in FIG. 2. Longitudinal dimensions of the sixth terminal F, the seventh terminal G, the eighth terminal H, and the ninth terminal E are almost equal to one another. Note that, in FIG. 2, the respective terminals are shown as projecting. However, the terminals only need to be exposed, and at least a portion of each of the terminals may be fitted to the surface or the inside of the package 12.

Here, the third terminal C and the fourth terminal D are arranged so as to be able to be short-circuited outside of the package 12. In the preferred embodiment, both of the third terminal C and the fourth terminal D are arranged on the same side of the package 12 in plan view as described above. That is, the third terminal C and the fourth terminal D extend in the same direction from the one side of the package 12 to the outside of the package 12. The third terminal C is arranged next to the fourth terminal D.

There is a gap between the third terminal C and the fourth terminal D. A length in a longitudinal direction (an up-down direction in FIG. 2) of the third terminal C is equal to a length in the longitudinal direction of the fourth terminal D. Because of the configuration, the third terminal C and the fourth terminal D can be easily electrically connected to each other by an electrically conductive wire.

Figure 3:
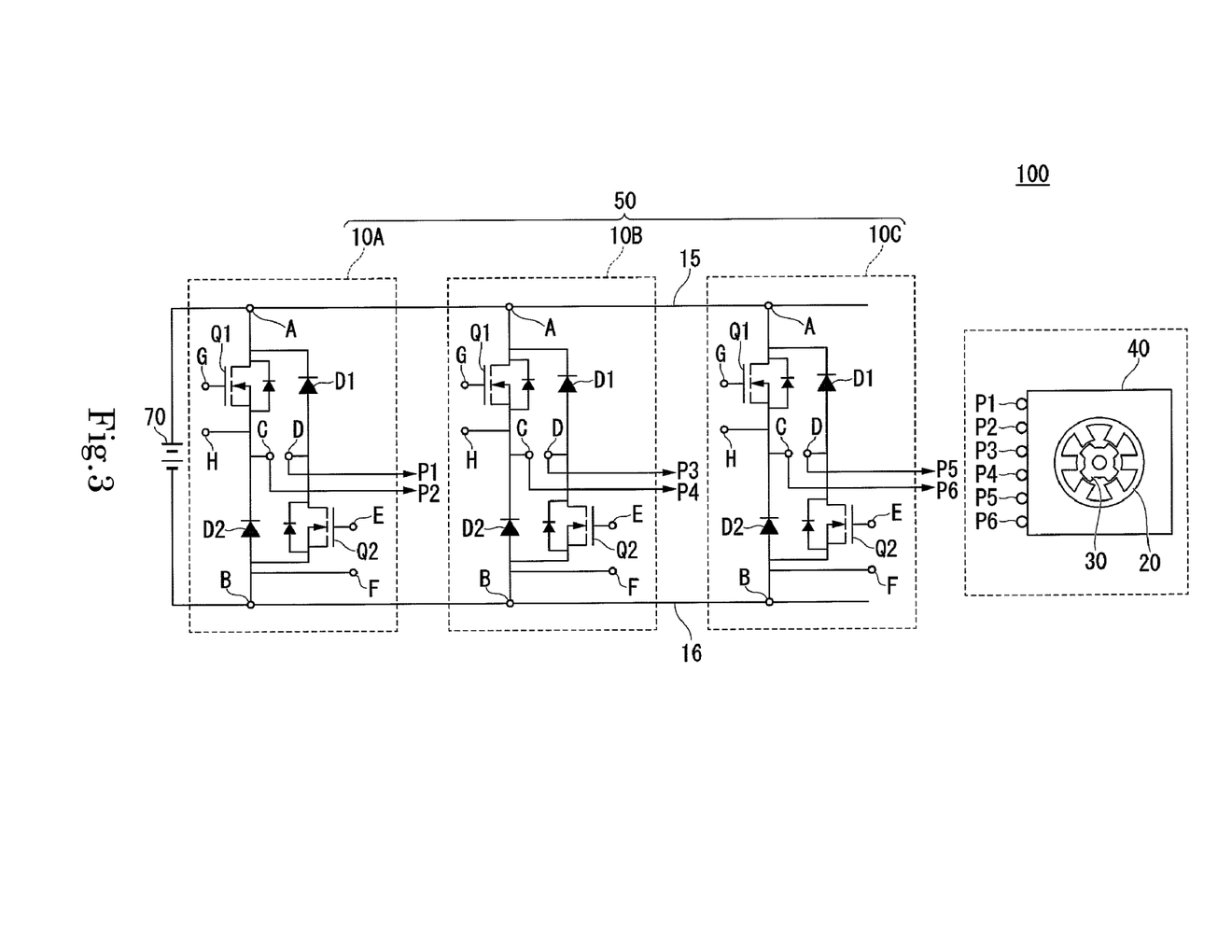
FIG. 3 is a view illustrating a configuration of a concentrated winding three-phase SR motor 100.
Figure 4:
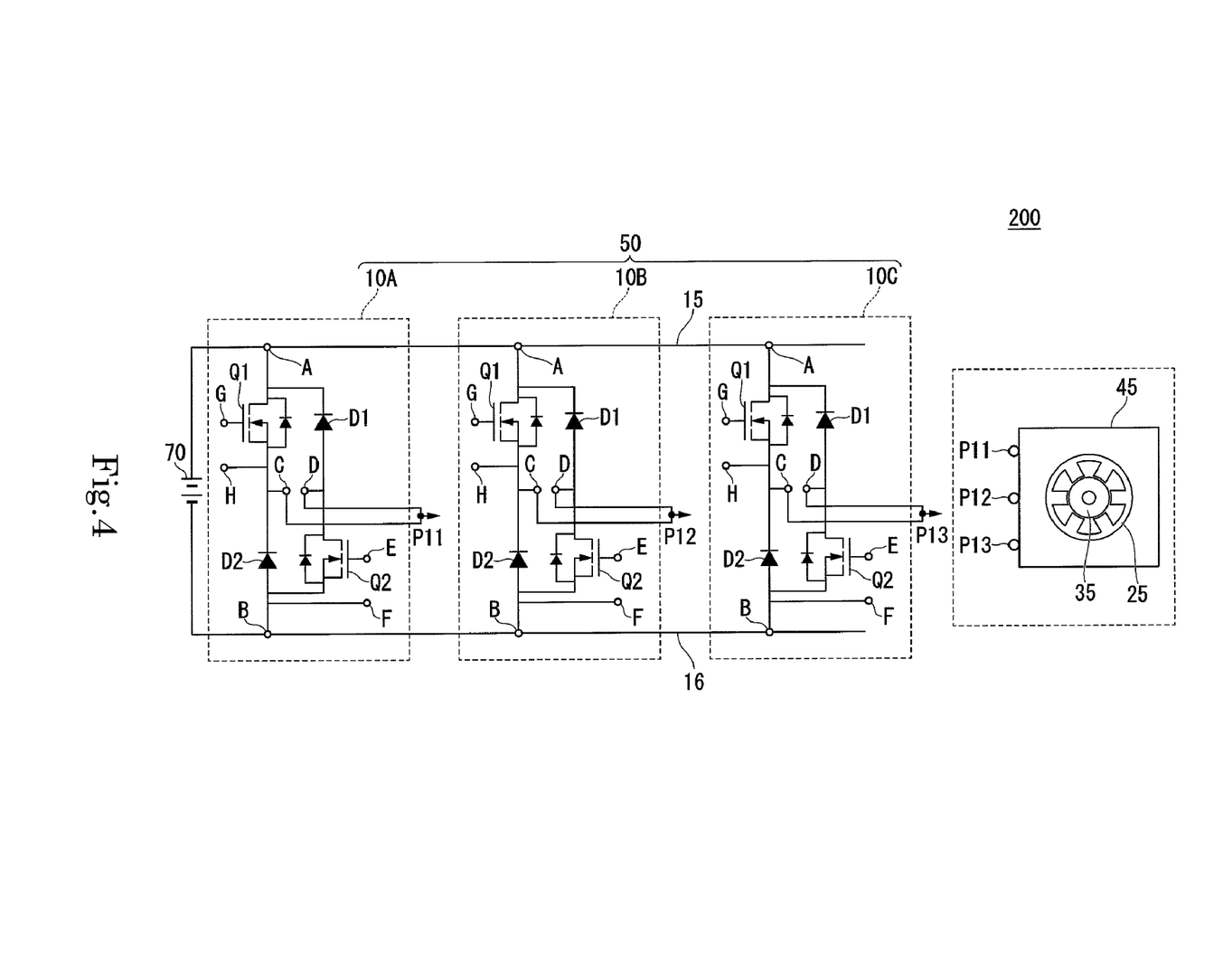
FIG. 4 a view illustrating a configuration of a three-phase synchronous motor 200.

From a state in which the third terminal C and the fourth terminal D are electrically connected to each other, the third terminal C and the fourth terminal D can be easily disconnected. As shown in FIG. 3, when the third terminal C and the fourth terminal D are not short-circuited, the module 10 can be used for a concentrated winding three-phase SR motor. On the other hand, as shown in FIG. 4, when the third terminal C and the fourth terminal D are short-circuited, the module 10 can be used for a three-phase synchronous motor. The module 10 is a power conversion apparatus that can be used for both of the concentrated winding three-phase SR motor and the three-phase synchronous motor by adding a simple configuration as described above. Therefore, the module 10 can be applied to a wide range of motors, and is thus suitable for mass production. Accordingly, in the module 10, an effect of cost reduction is easily obtained by the mass production. Also, in the preferred embodiment, the third terminal C and the fourth terminal D are arranged at the same height in the plate thickness direction. Because of the configuration, the electrically conductive wire connecting the third terminal C and the fourth terminal D can be arranged without being bent in the plate thickness direction. Therefore, the third terminal C and the fourth terminal D can be easily electrically connected to each other. In the preferred embodiment, distances of the through-hole of the third terminal C and the through-hole of the fourth terminal D from the one side of the package 12 are equal to each other. Because of the configuration, the electrically conductive wire connecting the third terminal C and the fourth terminal D can be arranged without being bent in a plane direction. Therefore, the third terminal C and the fourth terminal D are easily electrically connected to each other.

In FIG. 2, the first terminal A and the second terminal B extend in the same direction from the one side of the package 12 to the outside of the package 12. For example, a bypass capacitor can be arranged between the first terminal A and the second terminal B. The bypass capacitor is connected to both of the first terminal A and the second terminal B. Because of the configuration, a variation in a voltage of a direct-current power supply when the circuit element 11 is operated can be avoided. As a result, noise radiation can be suppressed.

Subsequently, a power conversion apparatus for which the above module 10 is used, and a motor connected to the power conversion apparatus are described by reference to FIGS. 3 and 4. FIG. 3 is a view illustrating a configuration of a concentrated winding three-phase SR motor 100. The concentrated winding three-phase SR motor 100 includes a power conversion apparatus 50. The power conversion apparatus 50 includes the three modules 10 (i.e., first, second, and third modules 10A, 10B, and 10C). In each of the modules 10, the first terminal A is connected to a wire 15 connected to a positive electrode of a power supply 70. The second terminal B is connected to a wire 16 connected to a negative electrode of the power supply 70. In the power conversion apparatus 50, the three modules 10 are connected in parallel to each other. That is, the power conversion apparatus 50 has a configuration in which three half bridge circuits are connected in parallel to each other.

A concentrated winding three-phase SR motor 100 includes a stator 20, a rotor 30, and a printed circuit board (PCB) 40. The rotor 30 is relatively rotatable about a center axis with respect to the stator 20. The PCB 40 is connected to the stator 20. The stator 20 includes 3n (n is a natural number) tooth portions that project inward in a radial direction based on the center axis, and a plurality of coils configured by winding a conductive wire around each of the tooth portions in a concentrated winding manner. The rotor 30 includes 2n salient pole portions that project outward in the radial direction. The respective salient pole portions face the tooth portions in the radial direction. In the preferred embodiment, the number of the tooth portions is three, and the number of the salient pole portions is four. However, the number of the tooth portions and the number of the salient pole portions are not limited thereto.

The PCB 40 includes a plurality of terminals P1 to P6. The terminals P1 to P6 are connected to the terminals of the power conversion apparatus 50, respectively. In the preferred embodiment, the terminal P1 and the terminal P2 are connected to a U-phase coil. The terminal P3 and the terminal P4 are connected to a V-phase coil. The terminal P5 and the terminal P6 are connected to a W-phase coil. More specifically, a winding-end portion of the U-phase coil is connected to the terminal P1. A winding-start portion of the U-phase coil is connected to the terminal P2. A winding-end portion of the V-phase coil is connected to the terminal P3. A winding-start portion of the V-phase coil is connected to the terminal P4. A winding-end portion of the W-phase coil is connected to the terminal P5. A winding-start portion of the W-phase coil is connected to the terminal P6. Note that another phase coil may be connected to each of the terminals P1 to P6.

As described above, the power conversion apparatus 50 includes the three modules 10. The modules 10 include the first module 10A, the second module 10B, and the third module 10C. The first module 10A, the second module 10B, and the third module 10C correspond to three phases (U, V, W phases) of the concentrated winding three-phase SR motor 100, respectively. Each of the first, second and third modules 10A, 10B, and 10C includes the circuit element 11. The first module 10A, the second module 10B, and the third module 10C have the same configuration. In the first module 10A, the fourth terminal D is connected to the terminal P1. The third terminal C is connected to the terminal P2. That is, the third terminal C of the first module 10A is connected to the winding-start portion of the corresponding U-phase coil via the PCB 40. The fourth terminal D is connected to the winding-end portion of the corresponding U-phase coil via the PCB 40. In the second module 10B, the fourth terminal D is connected to the terminal P3 of the PCB 40. The third terminal C is connected to the terminal P4. That is, the third terminal C of the second module 10B is connected to the winding-start portion of the corresponding V-phase coil via the PCB 40. The fourth terminal D is connected to the winding-end portion of the V-phase coil via the PCB 40. In the third module 10C, the fourth terminal D is connected to the terminal P5 of the PCB 40. The third terminal C is connected to the terminal P6. That is, the third terminal C of the third module 10C is connected to the winding-start portion of the corresponding W-phase coil via the PCB 40. The fourth terminal D is connected to the winding-end portion of the W-phase coil via the PCB 40. That is, each of the third terminals C of the three modules 10 provided in the power conversion apparatus 50 is connected to the winding-start portion of the corresponding phase coil via the PCB 40. Each of the fourth terminals D of the modules 10 is connected to the winding-end portion of the corresponding phase coil via the PCB 40.

As described above, in the configuration shown in FIG. 3, the first, second and the third modules 10A, 10B, and 10C are connected in parallel to each other. In each of the modules 10 connected in parallel, the corresponding coil of the stator 20 can be connected between the third terminal C and the fourth terminal D. The third terminal C and the fourth terminal D are connected to constitute a portion of a three-phase half bridge circuit. Accordingly, the modules 10 can be used for the power conversion apparatus 50 including the three-phase half bridge circuit. As a result, the power conversion apparatus 50 can be applied to the concentrated winding three-phase SR motor 100.

FIG. 4 is a view illustrating a configuration of a three-phase synchronous motor 200. According to the preferred embodiment, the power conversion apparatus 50 constituting a three-phase bridge circuit is configured. In the preferred embodiment, the third terminal C and the fourth terminal D in the module 10 are connected to constitute a portion of the three-phase bridge circuit. The three-phase synchronous motor 200 includes the power conversion apparatus 50. The power conversion apparatus 50 includes the three modules 10 (i.e., the first, second and the third modules 10A, 10B, and 10C). In each of the modules 10, the first terminal A is connected to the wire 15 connected to the positive electrode of the power supply 70. The second terminal B is connected to the wire 16 connected to the negative electrode of the power supply 70. The three modules 10 are connected in parallel to each other. Each of the third terminals C of the three modules 10 is connected to each of the fourth terminals D of the modules outside of the circuit configuration, that is, outside of the package 12 of the module 10.

A three-phase synchronous motor 200 includes a stator 25, a rotor 35, and a PCB 45. The stator 25 is a stator including a three-phase coil. The stator 25 includes a plurality of coils. The PCB 45 is electrically connected to the stator 25. The rotor 35 is relatively rotatable about a center axis with respect to the stator 25. The rotor 35 is arranged facing the stator 25 in a radial direction based on the center axis.

The PCB 45 includes a plurality of terminals P11, P12, and P13.

In the preferred embodiment, the terminal P11 is connected to a U-phase coil. The terminal P12 is connected to a V-phase coil. The terminal P13 is connected to a W-phase coil. The terminals P11, P12, and P13 of the PCB 45 are connected to the terminals of the power conversion apparatus 50, respectively. Therefore, for example, when the coil is formed in star connection, an opposite side of a neutral point of the U-phase coil is connected to the terminal P11. An opposite side of a neutral point of the V-phase coil is connected to the terminal P12. An opposite side of a neutral point of the W-phase coil is connected to the terminal P13.

Also, when the coil is formed in delta connection, a coupling point between the U-phase coil and the W-phase coil is connected to the terminal P11 of the PCB 45. A coupling point between the V-phase coil and the U-phase coil is connected to the terminal P12. A coupling point between the W-phase coil and the V-phase coil is connected to the terminal P13.

As described above, the power conversion apparatus 50 includes the three modules 10 (the first, second and the third modules 10A, 10B, and 10C). The first, second and the third modules 10A, 10B, and 10C correspond to three phases (U, V, W phases) of the three-phase synchronous motor 200. Each of the first, second and the third modules 10A, 10B, and 10C includes the circuit element 11 and has the same configuration. In the first module 10A, the third terminal C and the fourth terminal D are connected to each other outside of the first module 10A. A connection point between the third terminal C and the fourth terminal D is connected to the terminal P11. That is, the third terminal C and the fourth terminal D of the first module 10A are connected to the corresponding U-phase coil via the PCB 45. In the second module 10B, the third terminal C and the fourth terminal D are connected to each other outside of the module 10. A connection point between the third terminal C and the fourth terminal D of the second module 10B is connected to the terminal P12. That is, the third terminal C and the fourth terminal D of the second module 10B are connected to the V-phase coil via the PCB 45. In the third module 10C, the third terminal C and the fourth terminal D are connected to each other outside of the module 10. A connection point between the third terminal C and the fourth terminal D of the third module 10C is connected to the terminal P13. The third terminal C and the fourth terminal D of the third module 10C are connected to the corresponding W-phase coil via the PCB 45. That is, each of the third terminals C of the three modules 10 provided in the power conversion apparatus 50 is connected to each of the fourth terminals D of the modules. Each of the third terminals C and each of the fourth terminals D are connected to the corresponding phase coil via the PCB 45.

As described above, in the configuration shown in FIG. 4, the first, second and the third modules 10A, 10B, and 10C are connected in parallel to each other. Each of the third terminals C and each of the fourth terminals D are connected to each other outside of each of the modules 10.

Each of the third terminals C and each of the fourth terminals D are electrically connected to each other by using a lead wire, a metal member having electrical conductivity, or the like. Each of the connection points between the third terminals C and the fourth terminals D is electrically connected to the corresponding coil of the stator 25. A lead wire, a connector wire, or the like is used for electrical connection between each of the connection points and the coil. In the module 10, the third terminal C and the fourth terminal D are connected to constitute a portion of the three-phase bridge circuit. By using the three modules 10 in each of which the third terminal C and the fourth terminal D are connected, the power conversion apparatus 50 including the three-phase bridge circuit can be configured. As a result, the power conversion apparatus 50 can be applied to the three-phase synchronous motor 200.

According to the illustrative preferred embodiment explained above, when the third terminal C and the fourth terminal D are not short-circuited, the coil can be connected between the third terminal C and the fourth terminal D. It is thus possible to provide the module 10 that can be used for the concentrated winding three-phase SR motor 100. Also, when the third terminal C and the fourth terminal D are short-circuited, it is possible to provide the module 10 that can be used for the three-phase synchronous motor 200.

Figure 5:
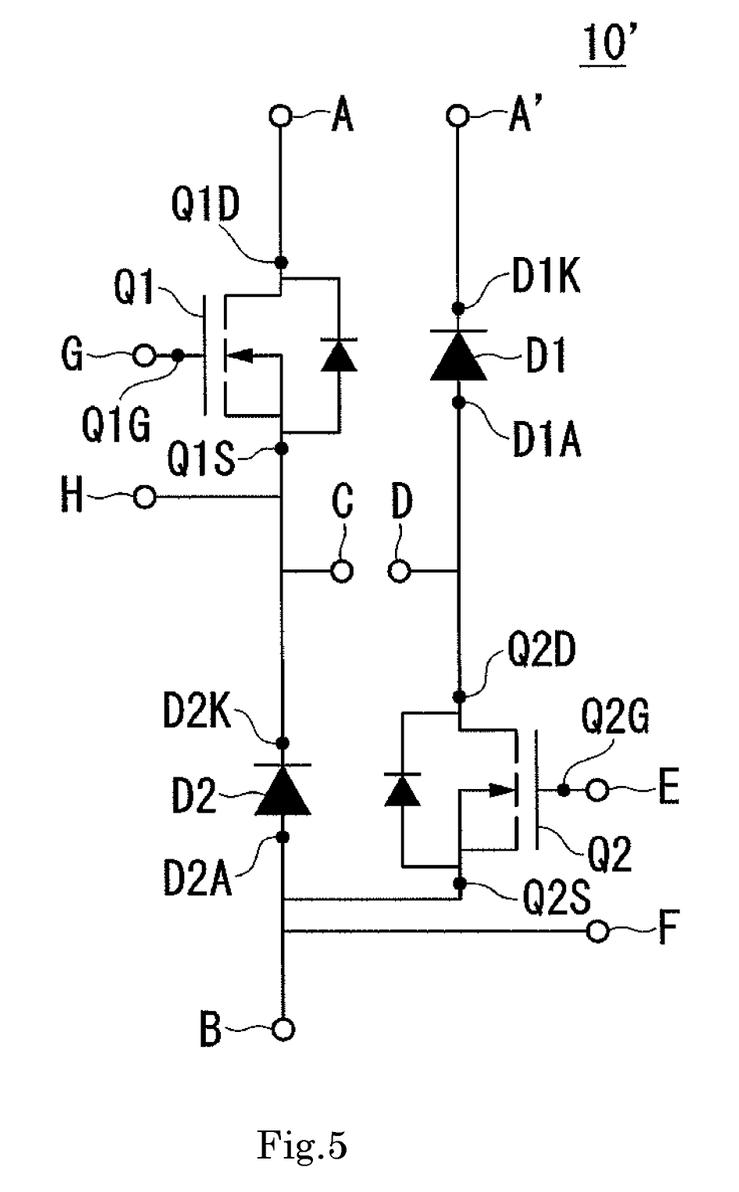
FIG. 5 is a view illustrating a circuit configuration of a module 10' of a half bridge circuit of the preferred embodiment of the present invention.

Although the preferred embodiments of the present invention have been described above, the present invention is not limited to the above preferred embodiments, and various changes may be made therein. FIG. 5 is a view illustrating a circuit configuration of a module 10' of the preferred embodiment. The same portions as those of the configuration shown in FIG. 1 are assigned the same reference numerals, and a description thereof is omitted. As shown in FIG. 5, in the module 10', the upper drain Q1D is connected to the first terminal A. However, the upper cathode D1K is connected to the fifth terminal A' separate from the first terminal A. That is, the first terminal A and the fifth terminal A' are separate terminals from each other. The fifth terminal A' is connected to a capacitor. Because of the configuration, a backflow current passing through the upper diode device D1 can be prevented from negatively affecting the wire 15.

In contrast to FIG. 5, in the module 10 shown in FIG. 1, the upper drain Q1D and the upper cathode D1K are connected to the same first terminal A.

That is, the first terminal A and the fifth terminal A' are the same terminal.

In the module 10, when a backflow current passing through the upper diode device D1 returns to the wire 15 connected to the positive electrode of the power supply 70, a load is applied between the wire 15 and the upper switching device Q1. In the module 10', the upper diode device D1 is connected to the capacitor separately from the wire 15. Because of the configuration, the backflow current passing through the upper diode device D1 can be prevented from negatively affecting the wire 15. Because of the configuration, noise of the backflow current can be also removed. Note that, in the case of the configuration in the modification, the first terminal A and the fifth terminal A' are short-circuited, whereby the module 10' can have the same circuit configuration as that of the module 10.

[Component Arrangement Inside the Module]

An internal configuration of a package of the module 10 is explained with reference to FIG. 6 to FIG. 8.

Figure 6:
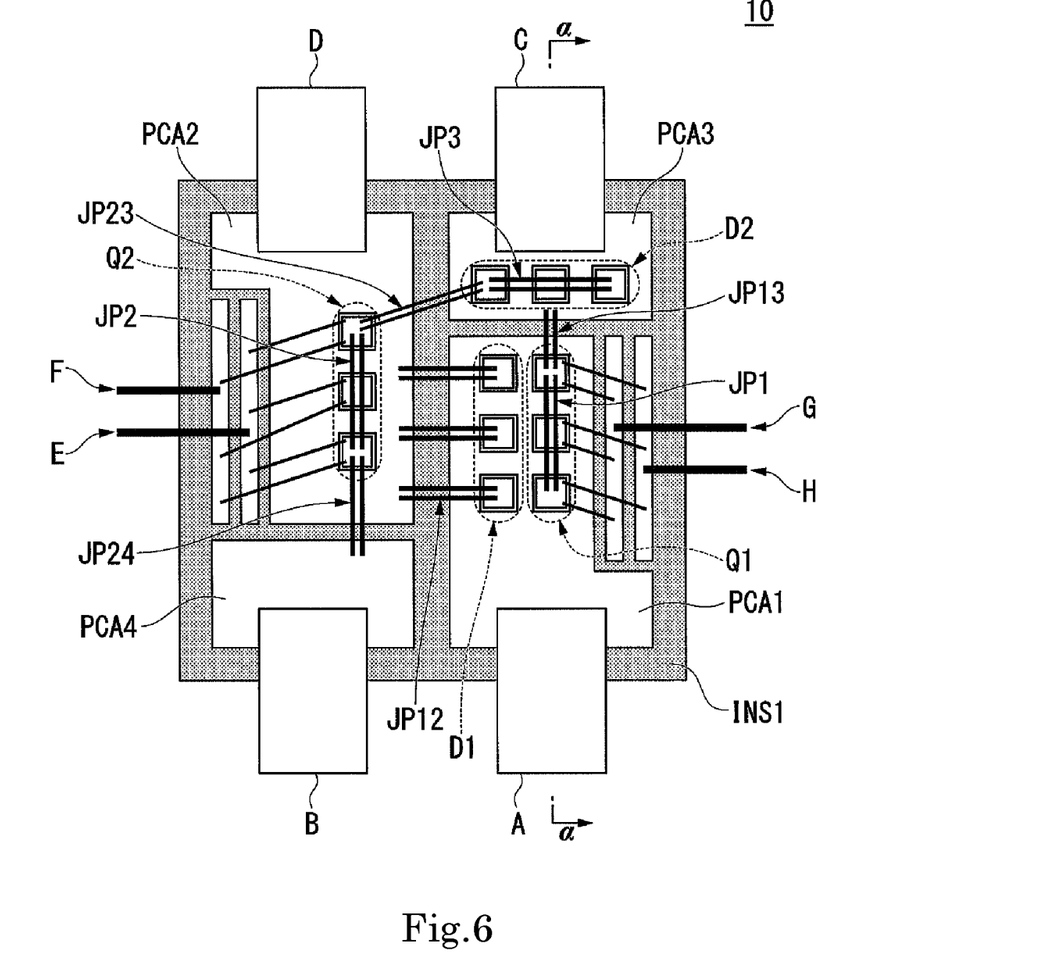
FIG. 6 arrangement of the module 10 of the half bridge circuit of the preferred embodiment of the present invention.

FIG. 6 is a view illustrating a component arrangement of the module 10 of the half bridge circuit of the preferred embodiment. FIG. 7 is a view illustrating a cross section of the module 10. FIG. 8 is a view illustrating a relation between the circuit configuration and the component arrangement of the module 10.

As shown in FIG. 6, the respective devices explained above are arranged on the inside of the package of the module 10. An insulating section INS1 and conductive regions PCA1 to PCA4 are arranged on the inside of the package. The conductive regions PCA1 to PCA4 are, for example, metal foil such as copper foil and aluminum foil. Note that the conductive regions PCA1 to PCA4 are referred to as first conductive region to fourth conductive region as well.

Figure 7:
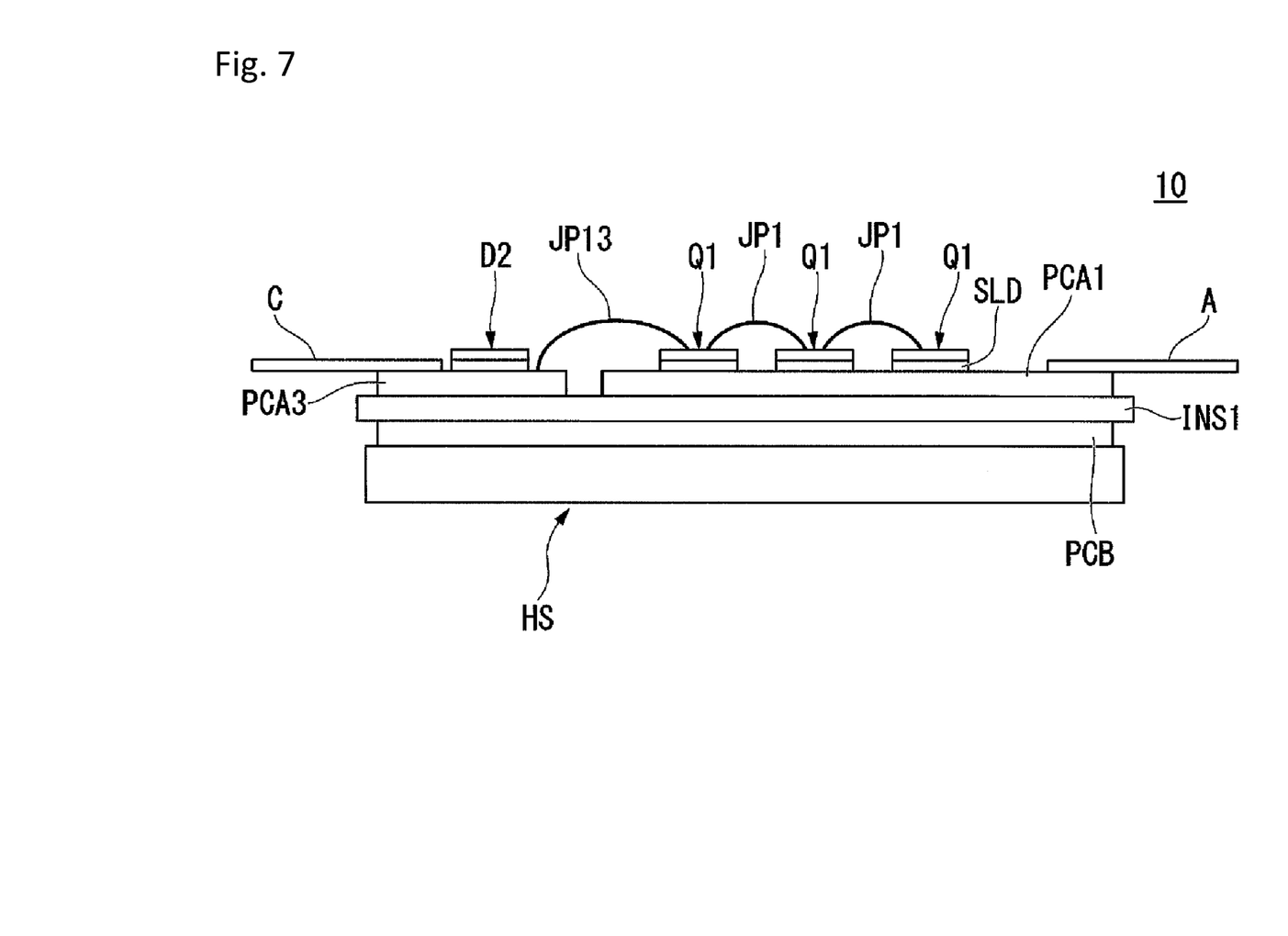
FIG. 7 is a view illustrating a cross section of the module 10.

As shown in FIG. 7, the conductive regions PCA1 to PCA4 are stacked on the insulating section INS1. The insulating section INS1 is an insulating material such as ceramics. The insulating section INS1 insulates the conductive regions PCA1 to PCA4 from one another. That is, the conductive regions PCA1 to PCA4 are insulated from one another by the insulating section INS1. Note that, in the following explanation, when the conductive regions PCA1 to PCA4 are not distinguished from one another, the conductive regions PCA1 to PCA4 are collectively referred to as conductive regions PCA. The conductive region PCA4 among the conductive regions PCA1 to PCA4 is not essential. For example, if connection of respective sections on the inside of the package and the second terminal B is possible by another configuration not via the conductive region PCA4, the conductive region PCA4 is not essential.

In the insulating section INS1, a conductive region PCB is stacked on a rear surface of a surface on which the conductive regions PCA are stacked. That is, the conductive region PCB, the insulating section INS1, and the conductive regions PCA are stacked in this described order. A ceramics double-sided board, in which copper foil or aluminum foil is bonded to front and rear surfaces of ceramics, may be used for the conductive region PCB, the insulating section INS1, and the conductive regions PCA.

Further, a cooling member HS may be attached to the conductive region PCB. The cooling member HS is a member for performing heat absorption such as a heat sink or a Peltier element. By including the cooling member HS, the module 10 can absorb heat generated from a switching device, a diode device, or the like and reduce the temperature of the module 10.

Note that the cooling member HS is attached to the conductive region PCB via an insulative adhesive, solder, or sinterable metal. When the thermal conductivity of the insulative adhesive, the solder, or the sinterable metal is relatively high, the temperature of the module 10 can be further reduced.

As shown in FIG. 6, an upper switching device Q1 and an upper diode device D1 are arranged in the conductive region PCA1. The first terminal A is connected to the conductive region PCA1. A lower switching device Q2 is arranged in the conductive region PCA2. The fourth terminal D is connected to the conductive region PCA2. A lower diode device D2 is arranged in the conductive region PCA3. The third terminal C is connected to the conductive region PCA3. The second terminal B is connected to the conductive region PCA4. That is, any one kind of a device of a switching device and a diode device is arranged in the conductive region PCA2 and the conductive region PCA3 among the conductive regions PCA1 to PCA3.

The upper switching device Q1 may have a configuration in which a plurality of switching devices are connected in parallel to one another. In a specific example shown in FIG. 6, in the upper switching device Q1, three switching devices are connected in parallel to one another. The plurality of switching devices constituting the upper switching device Q1 are connected to one another by a jumper wire JP1. The upper switching device Q1 is connected to the conductive region PCA3 by a jumper wire JP13.

Like the upper switching device Q1, the lower switching device Q2 may have a configuration in which a plurality of switching devices are connected in parallel. The plurality of switching devices constituting the lower switching device Q2 are connected to one another by a jumper wire JP2. The lower switching device Q2 is connected to the conductive region PCA4 by a jumper wire JP24.

The upper diode device D1 and the lower diode device D2 may also have a configuration in which a plurality of diode devices are connected in parallel to one another.

The plurality of diode devices constituting the lower diode device D2 are connected to one another by a jumper wire JP3. The lower diode device D2 is connected to the lower switching device Q2 by a jumper wire JP23.

The upper diode device D1 is connected to the conductive region PCA2 by a jumper wire JP12. That is, the plurality of diode devices constituting the upper diode device D1 are connected to one another by the jumper wire JP12 via the conductive region PCA2.

As shown in FIG. 7, the upper switching device Q1 is joined to the conductive region PCA1 by a joining member SLD such as solder or sintered silver. Note that, like the upper switching device Q1, the upper diode device D1, the lower diode device D2, and the lower switching device Q2 are joined to the respective conductive regions by the joining member SLD such as solder or sintered silver.

Figure 8:
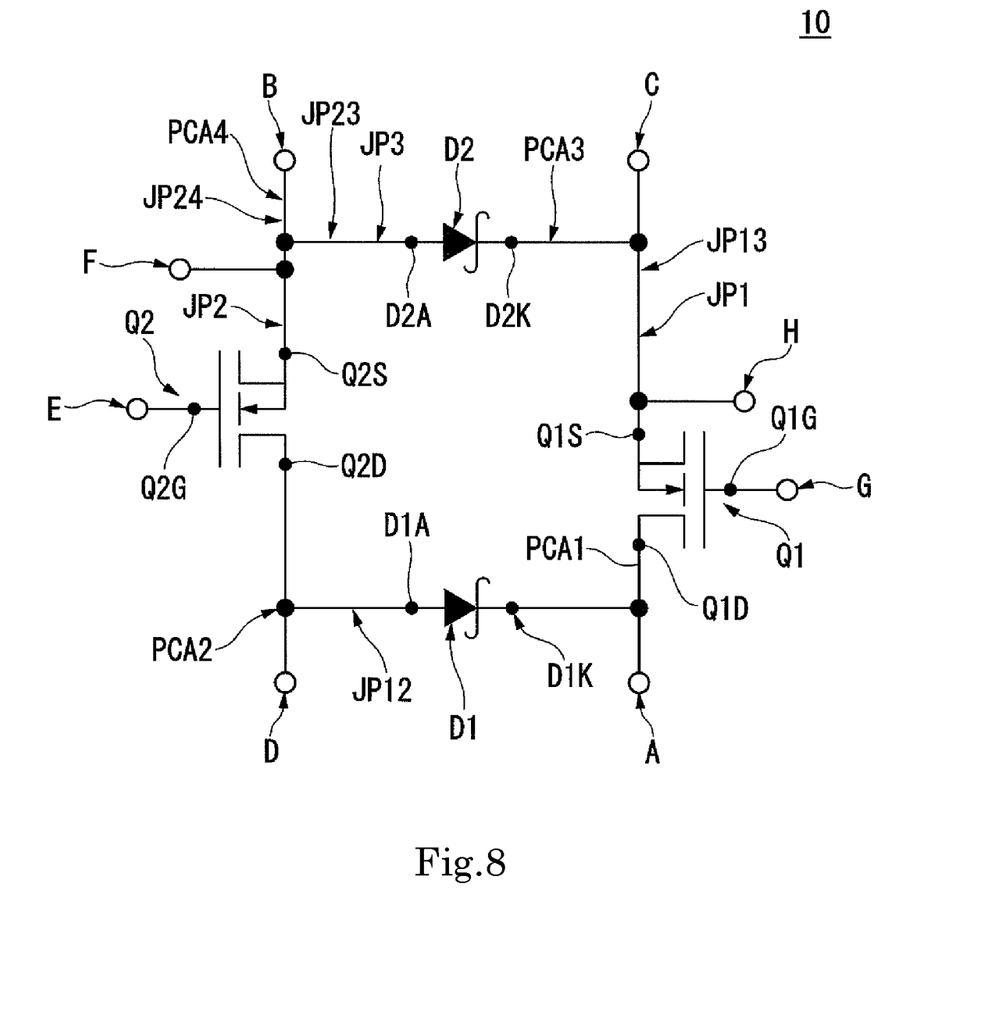
FIG. 8 is a view illustrating a relation between the circuit configuration and the component arrangement of the module 10.

As shown in FIG. 8, an upper drain Q1D of the upper switching device Q1 is connected to the conductive region PCA1. An upper cathode D1K of the upper diode device D1 is connected to the conductive region PCA1.

A lower drain Q2D of the lower switching device Q2 is connected to the conductive region PCA2. An upper anode D1A of the upper diode device D1 is connected to the conductive region PCA2 via the jumper wire JP12.

A lower cathode D2K of the lower diode device D2 is connected to the conductive region PCA3. An upper source Q1S is connected to the conductive region PCA3 via the jumper wire JP13.

A lower source Q2S of the lower switching device Q2 is connected to the conductive region PCA4 via the jumper wire JP24 and the jumper wire JP2. A lower anode D2A of the lower diode device D2 is connected to the conductive region PCA4 via the jumper wire JP23 and the jumper wire JP3.

A relation between the terminals of the module 10 and the conductive regions PCA is explained. As explained above, the conductive region PCA2 is connected to the fourth terminal D. The conductive region PCA3 is connected to the third terminal C. The conductive region PCA2 and the conductive region PCA3 are insulated from each other by the insulating section INS1. That is, the third terminal C and the fourth terminal D are not connected by the conductive region PCA on the inside of the package of the module 10.

If the third terminal C and the fourth terminal D are connected by the conductive region PCA on the inside of the package of the module, the three-phase synchronous motor 200 shown in FIG. 4 can be configured. However, when the third terminal C and the fourth terminal D are connected by the conductive region PCA on the inside of the package of the module, the concentrated winding three-phase SR motor 100 shown in FIG. 3 cannot be configured. That is, when the third terminal C and the fourth terminal D are connected by the conductive region PCA on the inside of the package of the module, a module that can be used for the concentrated winding three-phase SR motor 100 and the three-phase synchronous motor 200 cannot be provided.

On the other hand, in the module 10 explained above, the third terminal C and the fourth terminal D are not connected by the conductive region PCA on the inside of the package of the module 10. Because of the configuration, the module 10 can provide a module that can be used for the concentrated winding three-phase SR motor 100 and the three-phase synchronous motor 200.

That is, according to the illustrative preferred embodiment explained above, when the third terminal C and the fourth terminal D are not short-circuited on the outside of the package, the coil can be connected between the third terminal C and the fourth terminal D. Therefore, the module 10 that can be used for the concentrated winding three-phase SR motor 100 can be provided. When the third terminal C and the fourth terminal D are short-circuited on the outside of the package, the module 10 that can be used for the three-phase synchronous motor 200 can be provided.

Modifications of the module 10 are explained below with reference to FIG. 9 and FIG. 10. Note that, in the following explanation, components same as the components of the module 10 explained above are denoted by the same reference numerals and signs and explanation of the components is omitted.

Figure 9:
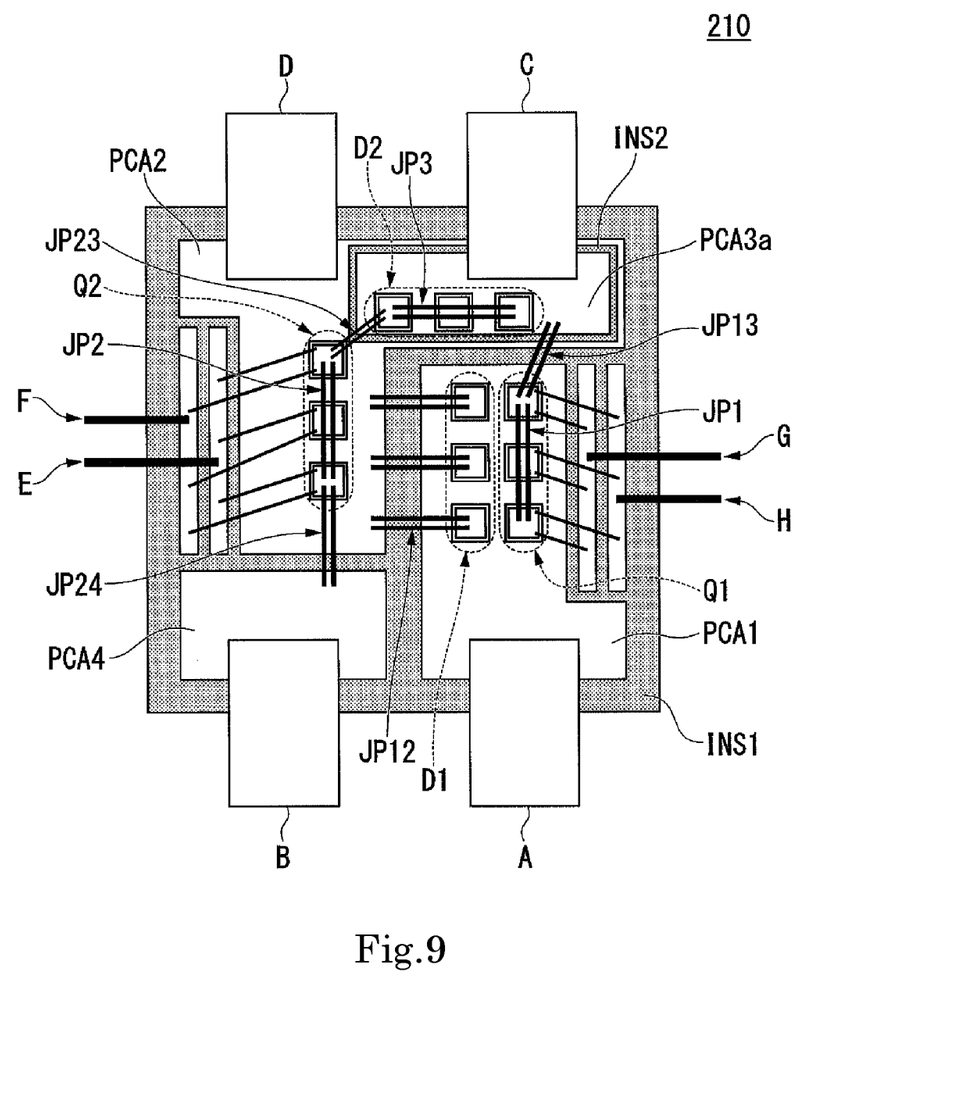
FIG. 9 is a view illustrating a component arrangement of a module 210 of a half bridge circuit according to a first modification of the preferred embodiment of the present invention.

FIG. 9 is a view illustrating a component arrangement of a module 210 of a half bridge circuit according to a first modification of the preferred embodiment.

The module 210 includes a conductive region PCA3a instead of the conductive region PCA3. The conductive region PCA3a is connected to the third terminal C. The conductive region PCA3a is stacked on the conductive region PCA2 via an insulating section INS2. That is, the conductive region CPA2 and the conductive region PCA3a are insulated from each other on the inside of a package of the module 210.

That is, at least two conductive regions PCA among the plurality of conductive regions PCA provided in the module 210 are configured to be insulated from each other by staking the other conductive region PCA on a portion of one conductive region PCA via the insulating section INS2.

In a module constituting the three-phase synchronous motor 200, the third terminal C and the fourth terminal D are sometimes connected by the conductive region PCA2 on the inside of the package.

When the module 210 is created on the basis of the module constituting the three-phase synchronous motor 200, it is only necessary to stack the insulating section INS2 and the conductive region PCA3a on the conductive region PCA2 and connect the third terminal C to the conductive region PCA3a. That is, with the module 210, the module constituting the three-phase synchronous motor 200 can be changed to, according to a simple procedure, a module that can be used for the concentrated winding three-phase SR motor 100.

Figure 10:
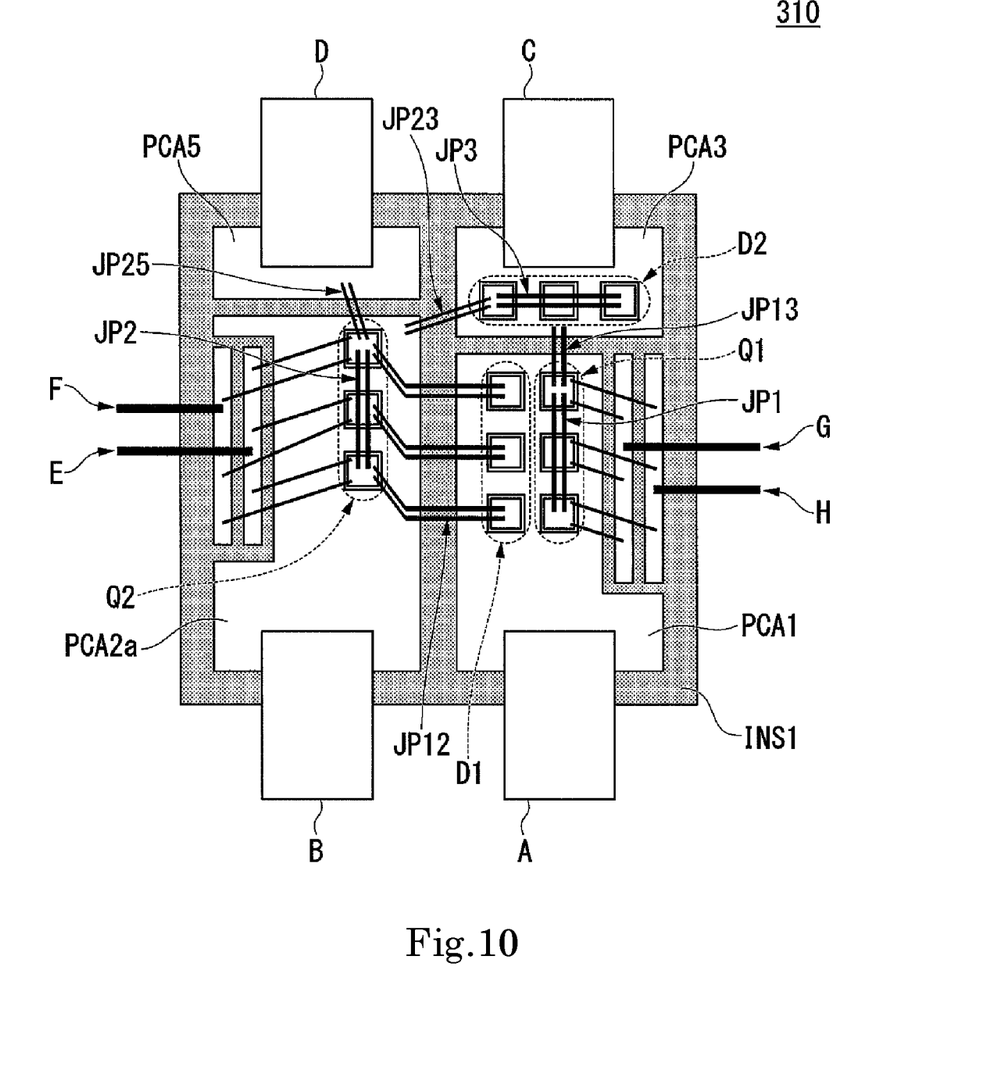
FIG. 10 is a view illustrating a component arrangement of a module 310 of a half bridge circuit according to a second modification of the preferred embodiment of the present invention.

FIG. 10 is a view illustrating a component arrangement of a module 310 of a half bridge circuit according to a second modification of the preferred embodiment. The module 310 is different from the module 10 in that the module 310 includes a conductive region PCA2a and a conductive region PCA5 instead of the conductive region PCA2 and the conductive region PCA4.

Whereas the conductive region PCA2 is connected to the fourth terminal D, the conductive region PCA2a is connected to the second terminal B. Whereas the lower drain Q2D of the lower switching device Q2 is connected to the conductive region PCA2, the lower source Q2S of the lower switching device Q2 is connected to the conductive region PCA2a.

The conductive region PCA5 is connected to the fourth terminal D. The lower drain Q2D of the lower switching device Q2 is connected to the conductive region PCA5 via the jumper wire JP2 and a jumper wire JP25.

Because of the configuration, the module 310 can provide a module that can be used for the concentrated winding three-phase SR motor 100 and the three-phase synchronous motor 200.

The configurations of the above preferred embodiments and the respective modifications may be appropriately combined as long as there are no mutual inconsistencies.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A module that constitutes at least a portion of a power conversion apparatus, comprising:
   a package;
   a circuit element that is arranged within the package; and
   a plurality of terminals,
   wherein the circuit element includes an upper switching device, a lower switching device, an upper diode device, and a lower diode device,
   the upper switching device includes an upper drain and an upper source,
   the upper drain is connected to a first terminal connected to a positive electrode of a power supply out of the plurality of terminals, and the upper source is connected to a third terminal out of the plurality of terminals,
   the lower switching device includes a lower drain and a lower source,
   the lower drain is connected to a fourth terminal out of the plurality of terminals, and the lower source is connected to a second terminal connected to a negative electrode of the power supply out of the plurality of terminals, the upper diode device includes an upper anode and an upper cathode, the upper anode is connected to the fourth terminal, and the upper cathode is connected to a fifth terminal out of the plurality of terminals, the lower diode device includes a lower anode and a lower cathode, the lower anode is connected to the second terminal, and the lower cathode is connected to the third terminal, the third terminal and the fourth terminal are arranged so as to be able to be short-circuited outside of the package, and the third terminal and the fourth terminal physically extend outward from the package in a same direction and substantially in parallel with one another.

2. The module according to claim 1, wherein the first terminal and the fifth terminal in the plurality of terminals are a same terminal.

3. The module according to claim 1, wherein the first terminal and the fifth terminal are separate terminals from each other.

4. The module according to claim 1, wherein each of the devices constituting the circuit element is formed of an SiC device.

5. A power conversion apparatus comprising a trio of the modules according to claim 1, wherein, in each of the modules, the first terminal is connected to a wire connected to the positive electrode, the second terminal is connected to a wire connected to the negative electrode, and the three modules are connected in parallel to one another.

6. A switched reluctance motor comprising:
the power conversion apparatus according to claim 5;
a stator including 3n (n is a natural number) tooth portions that project inward in a radial direction and a coil that is wound around each of the tooth portions in a concentrated winding manner;
a rotor including 2n salient pole portions that project outward in the radial direction; and
a circuit board that is connected to the terminals of the power conversion apparatus, wherein
each of the third terminals of the three modules provided in the power conversion apparatus is connected to a winding start portion of a corresponding phase coil via the circuit board, and each of the fourth terminals is connected to a winding end portion of the corresponding phase coil via the circuit board.

7. A three-phase synchronous motor comprising:
the power conversion apparatus according to claim 5;
a stator including a three-phase coil;
a rotor that faces the stator in a radial direction; and
a circuit board that is connected to the terminals of the power conversion apparatus, wherein
each of the third terminals of the three modules provided in the power conversion apparatus is connected to each of the fourth terminals of the modules, and each of the third terminals and each of the fourth terminals is connected to a corresponding phase coil via the circuit board.

8. A module constituting at least a portion of a power conversion apparatus, the module comprising:
a package;
a switching device and a diode device arranged on an inside of the package;
a plurality of conductive regions arranged on the inside of the package;
an insulating section that insulates the conductive regions from one another;
a first terminal connected to a positive electrode of a power supply;
a second terminal connected to a negative electrode of the power supply; and
a third terminal and a fourth terminal arranged to be able to be short-circuited on an outside of the package, wherein
one kind of a device of the switching device and the diode device is arranged in at least one conductive region among the plurality of conductive regions,
the plurality of conductive regions include a first conductive region connected to the first terminal, a second conductive region connected to one terminal of the second terminal or the fourth terminal, and a third conductive region connected to the third terminal, and
the third terminal and the fourth terminal physically extend outward from the package in a same direction and substantially in parallel with one another.

9. The module according to claim 8, wherein
the switching device includes an upper switching device and a lower switching device,
the diode device includes an upper diode device and a lower diode device,
the upper switching device and the lower diode device are arranged in the first conductive region,
the lower switching device is arranged in the second conductive region, and
the upper diode device is arranged in the third conductive region.

10. The module according to claim 9, wherein
the upper switching device includes an upper drain connected to the first terminal via the first conductive region and an upper source connected to the third terminal via the third conductive region,
the lower switching device includes a lower drain connected to the fourth terminal and a lower source connected to the second terminal, when the second conductive region is connected to the fourth terminal, the lower drain is connected to the fourth terminal via the second conductive region, and, when the second conductive region is connected to the second terminal, the lower source is connected to the second terminal via the second conductive region,
the upper diode device includes an upper anode connected to the third terminal via the third conductive region and an upper cathode connected to the second terminal, and
the lower diode device includes a lower anode connected to the fourth terminal and a lower cathode connected to the first terminal via the first conductive region.

11. The module according to claim 8, wherein at least two conductive regions among the plurality of conductive regions are insulated from each other by stacking the other conductive region on a portion of one conductive region via the insulating section.

12. The module according to claim 8, further comprising:
a board on which the conductive regions are arranged; and
a cooling member attached to, via an insulative adhesive, solder, or sinterable metal, on a surface of the substrate, a rear surface of a surface on which the switching device and the diode device are arranged.

13. A power conversion apparatus comprising a trio of the modules according to claim 8, wherein, in each of the modules, the first terminal is connected to a wire connected to the positive electrode, the second terminal is connected to a wire connected to the negative electrode, and the three modules are connected in parallel to one another.

14. A switched reluctance motor comprising:
the power conversion apparatus according to claim 13;
a stator including 3n (n is a natural number) tooth portions that project inward in a radial direction and a coil that is wound around each of the tooth portions in a concentrated winding manner;
a rotor including 2n salient pole portions that project outward in the radial direction; and
a circuit board that is connected to the terminals of the power conversion apparatus, wherein
each of the third terminals of the three modules provided in the power conversion apparatus is connected to a winding start portion of a corresponding phase coil via the circuit board, and each of the fourth terminals is connected to a winding end portion of the corresponding phase coil via the circuit board.

15. A three-phase synchronous motor comprising:
the power conversion apparatus according to claim 13;
a stator including a three-phase coil;
a rotor that faces the stator in a radial direction; and
a circuit board that is connected to the terminals of the power conversion apparatus, wherein
each of the third terminals of the three modules provided in the power conversion apparatus is connected to each of the fourth terminals of the modules, and each of the third terminals and each of the fourth terminals is connected to a corresponding phase coil via the circuit board.

* * * * *